United States Patent
Nodenot (10) Patent No.: US 11,146,340 B2
(45) Date of Patent: Oct. 12, 2021

(54) COMPLEMENTARY DATA FLOW FOR NOISE REDUCTION

(71) Applicant: MACOM Technology Solutions Holdings, Inc., Lowell, MA (US)

(72) Inventor: Nicolas Alain Paul Nodenot, La Colle sur Loup (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/008,303

(22) Filed: Aug. 31, 2020

(65) Prior Publication Data
US 2021/0091861 A1 Mar. 25, 2021

(30) Foreign Application Priority Data
Sep. 23, 2019 (FR) .................................. FR1910458

(51) Int. Cl.
*H04B 15/00* (2006.01)
*H04L 1/00* (2006.01)

(52) U.S. Cl.
CPC ......... *H04B 15/005* (2013.01); *H04L 1/0071* (2013.01)

(58) Field of Classification Search
CPC . H03K 19/0016; H04B 15/005; H04L 1/0071
See application file for complete search history.

(56) References Cited

U.S. PATENT DOCUMENTS

| | | | |
|---|---|---|---|
| 6,346,832 B1 | 2/2002 | Young | |
| 8,225,017 B1 | 7/2012 | Tang et al. | |
| 2005/0242841 A1* | 11/2005 | Mitsuishi | H03K 19/00346 326/93 |
| 2009/0091369 A1* | 4/2009 | Farmer | H03K 19/00346 327/365 |
| 2009/0195272 A1* | 8/2009 | Okuzono | G09G 3/20 327/141 |

(Continued)

FOREIGN PATENT DOCUMENTS

| | | |
|---|---|---|
| JP | 2011-211410 | 10/2011 |
| WO | WO 2019/003588 | 1/1919 |

OTHER PUBLICATIONS

International Search Report dated Nov. 30, 2020 for corresponding Application No. PCT/2020/048817.

(Continued)

*Primary Examiner* — Freshteh N Aghdam
(74) *Attorney, Agent, or Firm* — Weide & Miller, Ltd.

(57) ABSTRACT

A method and system for reducing power supply noise comprising receiving a primary data stream at a data rate. The primary data stream comprises a stream of bits having logical values of either zero or one. Then, splitting the primary data stream to create a first group of lower rate data streams and a second group of lower rate data streams. Processing the second group of lower rate data streams to invert the logic values of the bits of the lower rate data streams to create processed lower rate data streams. The first group of lower rate data streams are combined with the processed lower rate data streams to create a complementary data stream. Then, processing the primary data stream and the complementary data stream concurrently with a data processing system, the concurrent processing reducing noise on the power supply.

19 Claims, 11 Drawing Sheets

(56) References Cited

U.S. PATENT DOCUMENTS

| | | |
|---|---|---|
| 2010/0052765 A1 | 3/2010 | Makino |
| 2013/0015881 A1 | 1/2013 | Lee et al. |
| 2017/0359636 A1 | 12/2017 | Nagarajan |
| 2020/0106439 A1* | 4/2020 | Fun Abash, I ... H03K 19/00346 |

OTHER PUBLICATIONS

French National Institute of Industrial Property ("INPI") Preliminary Report issued for Application No. FR1910458 dated Jun. 19, 2020.

* cited by examiner

COMPLEMENTARY DATA FLOW FOR NOISE REDUCTION

1. FIELD OF THE INVENTION

The invention relates to noise reduction in a data processing system, and in particular to a system and method for creating and using a complementary data stream to reduce noise.

2. RELATED ART

Efficient and accurate data communication and processing is vital to enabling high speed communications. Numerous systems utilize data communications including the Internet, data centers, telecommunication, and point to point communication systems.

The data is typically a series of logical zero and one values, which form a high-speed data stream. When the data stream passes through the channel, it is affected by the channel. One of the challenges in the prior art is to accurately receive and process the data stream. Of importance, in the case of data being processed for transmission over a channel or subsequent processing, is to maintain the data, and the processing environment, as noise free so as to not degrade the data being processed or the processing environment.

When processing a data signal or data stream, each transition between logic level of the data signal draws current from a power supply node. As a result, each transition drop the voltage on the supply node, which introduces noise or jitter into the supply node. This noise on the supply node can corrupt the data being processed and, in a multi-channel system, will also couple in to the other channels, thereby disrupting operation of the other channels.

One proposed solution is to utilize a number of capacitors to smooth the transients of the supply node. However, capacitors add additional cost, consume valuable space, and do not fully solve the problem. The disclosed system overcomes the drawbacks in the prior art and provides additional benefits.

SUMMARY

A method for reducing noise in a signal comprising receiving a primary data stream at a high data rate, the primary data stream comprising a stream of bits having logical values. Then, splitting the primary data stream to create a first group of one or more lower rate data streams and a second group of one or more lower rate data streams. Then processing the second group of lower rate data streams to invert the logic values of the bits that form the lower rate data streams in the second group to create one or more processed lower rate data streams. This method combines the first group of one or more lower rate data streams with the one or more processed lower rate data streams to create a complementary data stream. The primary data stream is processed concurrently with the complementary data stream with a data processing system to reduce noise on a power supply that provides current to the data processing system.

The step of combining may comprise interleaving. In one embodiment, the splitting comprises converting the primary data stream into a first lower rate data stream in the first group and a second lower rate data stream in the second group. The complementary data stream has a logic level transition at every clock cycle that the primary data stream does not have a logic level transition. In one embodiment, the step of combining is performed by a serializer. Processing the primary data stream and the complementary data stream occurs concurrently with a data processing system to establish a constant average current draw over time from the power supply. It is contemplated that this method may occur in a crosspoint switch.

Also disclosed is a method for reducing noise on a power supply due to signal processing comprising receiving a primary data stream such that the primary data stream comprising a stream of bits having logical values. Then creating a complementary data stream. The complementary data stream having an opposite transition pattern than the primary data stream such that at clock cycles when the primary data stream has a logic level transition the complementary data stream does not transition, and at clock cycles when the primary data stream does not have a logic level transition, the complementary data stream has a transition. Then processing the primary data stream and the complementary data stream concurrently with a data processing system to reduce noise on a power supply such that the power supply provides current to the data processing system.

The multiple data processing systems may share the power supply. In one configuration, processing the primary data stream and the complementary data stream concurrently comprises processing at the same time and on adjacent paths to be in close proximity. In one embodiment, the method further includes transmitting or buffering the primary data stream, after processing, and terminating the complementary data stream to an open circuit. The reduction of noise on a power supply occurs due to the processing of the primary data stream and the complementary data stream concurrently creating a generally constant average power draw from the power supply. This method of operation may occur in a multi-channel crosspoint switch and the reduction of noise occurs in other channels of the multi-channel crosspoint switch.

Also disclosed herein is a system for retiming and recovering a data stream with reduced noise introduction. This embodiment includes a clock and data recovery module configured to receive a primary data stream to recover clock and timing for the primary data stream. A complementary data stream generation unit is configured to generate a complementary data stream. The complementary data stream has a logic level transition at each clock cycle in which the primary data stream does not have a logic level transition. A signal processing unit is configured to concurrently process the primary data stream and the complementary data stream to create a processed primary data stream and a processed complementary data stream. A transmitter is provided to transmit the processed primary data stream. A power supply is configured to supply current to the signal processing unit. The power supply has stable average current draw due to the primary data stream and the complementary data stream, when considered together, having a logic level transition at every clock cycle.

In one embodiment, the signal processing unit comprises one or more inverters and one or more multiplexers. The complementary data stream generation unit may comprise logic elements configured to process the primary data stream and a clock signal to generate the complementary data stream. The signal processing unit may be a multi-channel crosspoint switch. In one configuration the processed complementary data stream is terminated to an open circuit.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawbacks of the prior art and provide additional benefits, it is disclosed to create, in response to a primary data stream, a complementary data stream that has a transition pattern that establishes a logic level transition at every clock cycle in which the primary data stream does not have a logic level transition. For clock cycles in the primary data stream in which there is a transition, the complementary data stream does not have a transient, but for clock cycles in which the primary data stream does not have a transition, the complementary data stream has a transient. Thus, the complementary data stream may be considered a transition opposite data stream.

Figure 1A:
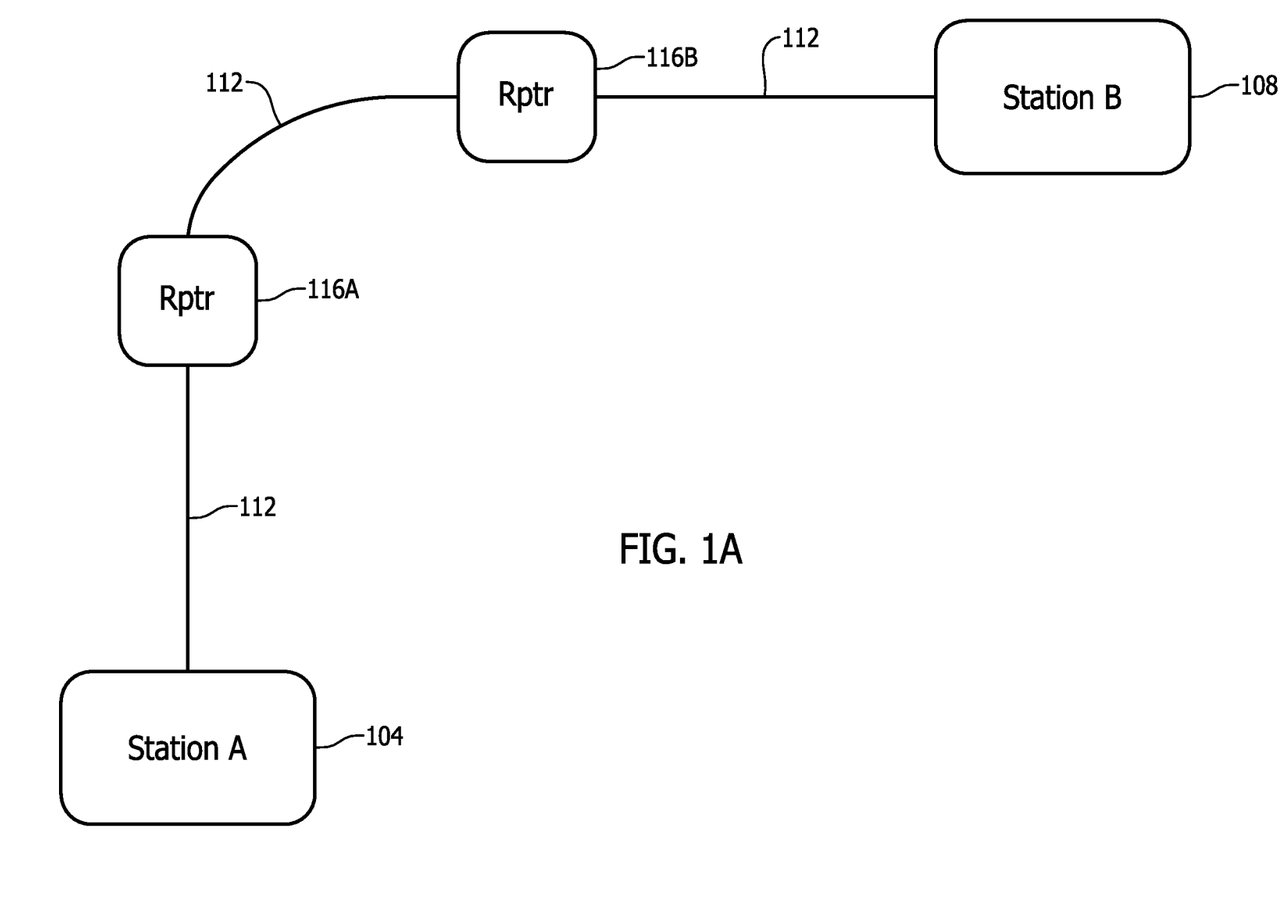
FIG. 1A illustrates a block diagram of an exemplary first environment of use.

FIG. 1A illustrates an example environment of use of the present invention. In one example embodiment, the method and apparatus disclosed herein is utilized to communicate data between a first station 104 and second station 108. The data may travel over any path, conductor or channel 112. The conductor or channel 112 may comprise, but is not limited to, one or more metallic conductors, an optical channel, or free space communication such as radio or other frequency communication, or any other type channel. If the distance between the first station 104 and the second station 108 is significant, one or more repeaters 116A, 116B may be required to process the data so that the data may reach the desired station and be recovered. As is understood, a repeater 116 may comprise a device that receives a signal and restores or amplifies the signal to a desired format before resending the signal onward. It is also contemplated that there may exist repeaters 116 or stations in addition to those shown, or some systems may be configured without repeaters.

Figure 1B:
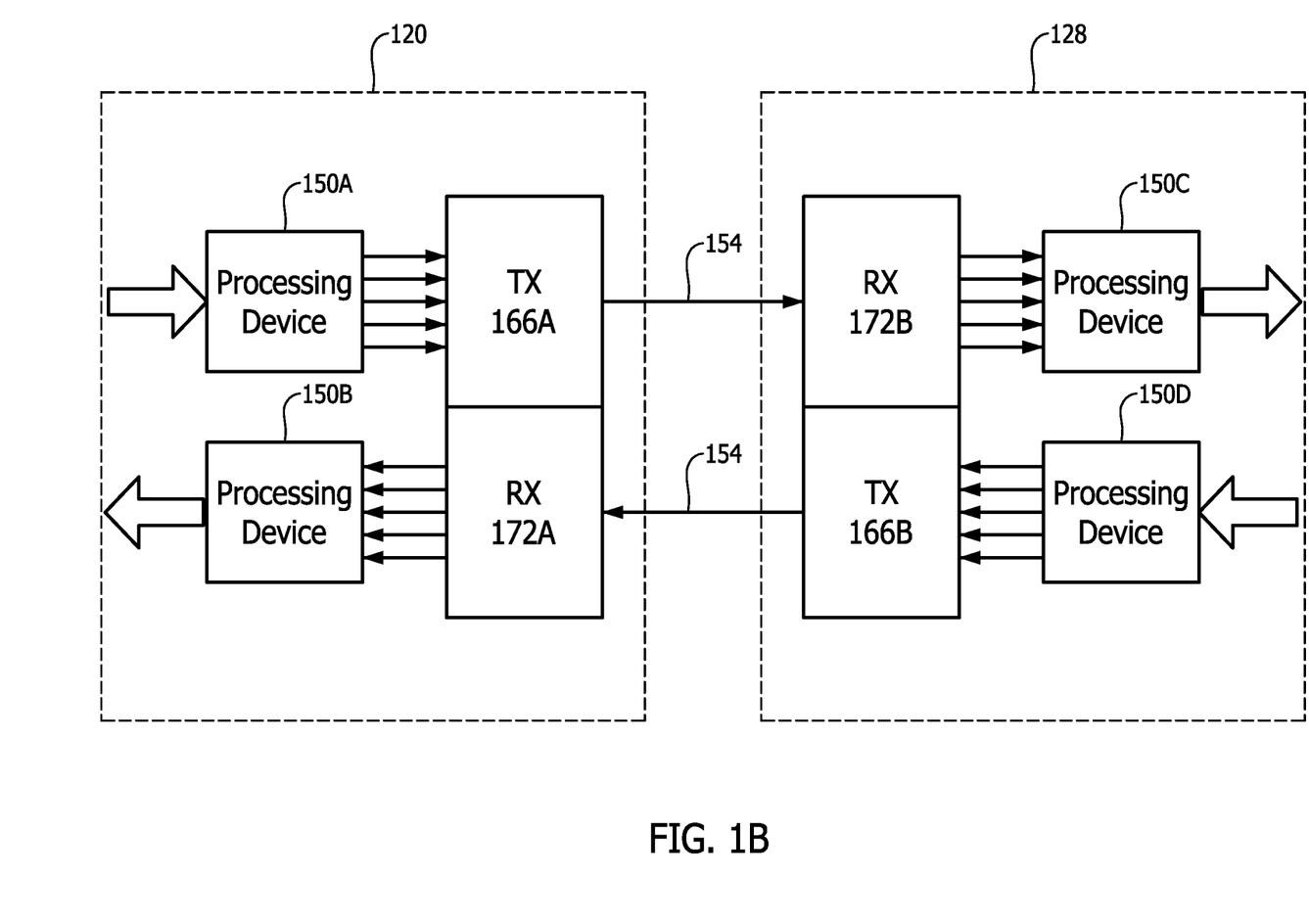
FIG. 1B illustrates a block diagram of an exemplary second environment of use.

FIG. 1B illustrates a block diagram of an example embodiment of a multi-station communication system configured in accordance with the method and apparatus disclosed herein. As shown, a first station 120 is configured to communicate over one or more channels 154 with a second station 128. Each of the first station 120 and the second station 128 may comprise a receiver 172A, 172B and a transmitter 166A, 166B. At least one of the receivers 172A, 427B and transmitters 166A, 166B connect to a processing device 150A, 150B, 150C, 150D as shown. The processing devices 150 may comprise one or more processor, ASIC, control logic, switch fabric, modulator, demodulator, inverters, multiplexers, buffers, or any other device. Input to the processing devices 150 may occur in any manner known in the art. Similarly, although certain paths or interfaces are shown as either serial or parallel, it is fully contemplated that any of these paths may be configured as either serial or parallel paths or both.

Figure 1C:
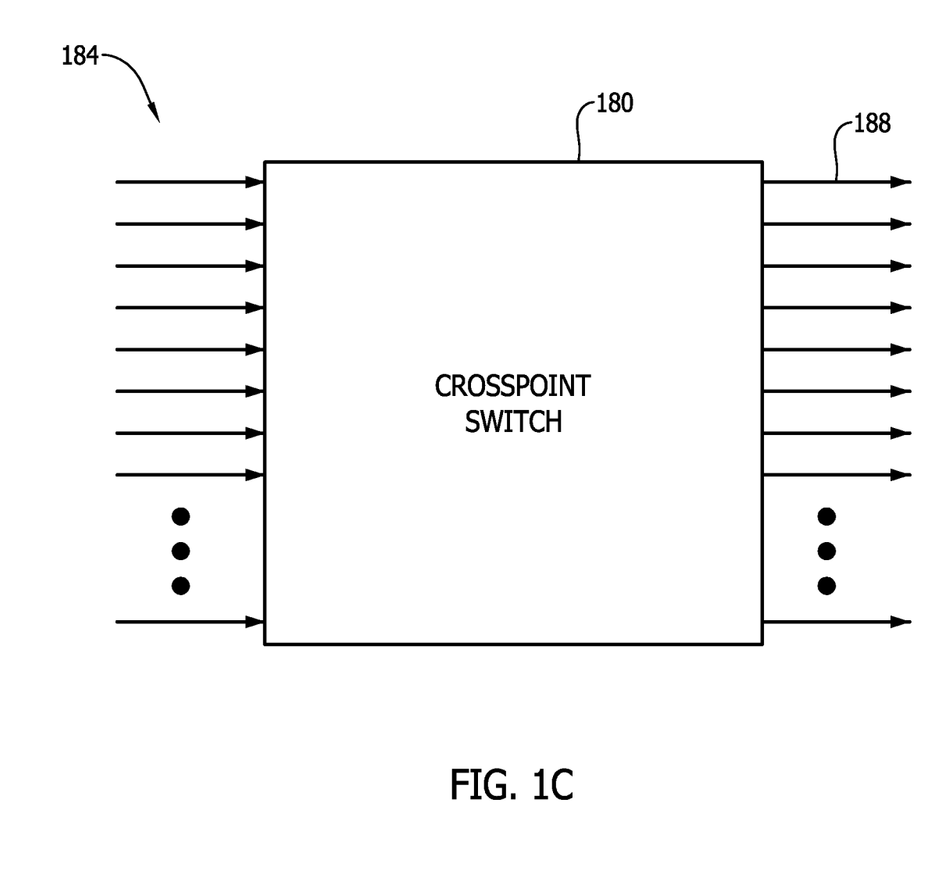
FIG. 1C illustrates a block diagram of an exemplary third environment of use.

FIG. 1C illustrates an example embodiment of an example environment of use. In this embodiment, the innovation disclosed herein may be configured as part of a crosspoint switch 180 having a plurality of inputs 184 and a plurality of outputs 188. A cross point switch 180 is a collection of switches arranged in a matrix configuration. Any number of inputs 184 and outputs 188 may be provided. In one embodiment, the cross point switch has 288 different inputs and 288 different outputs (channels) and any input may be routed to any output. The processing elements for each channel may receive power from a shared power supply node (not shown). In a crosspoint switch 180, the multiple input and output lines form a crossed pattern of interconnecting elements between which a connection may be established by closing a switch or establishing a multiplexer connection, or other connection located at each intersection.

Although shown in these example environments of use, it is contemplated that any system may benefit from the method and apparatus disclosed herein. Any system with a clock and data recovery module or function, will benefit from this innovation. Similarly, any system that receives and re-times data may benefit from the innovation disclosed herein.

Figures 2A, 2B:
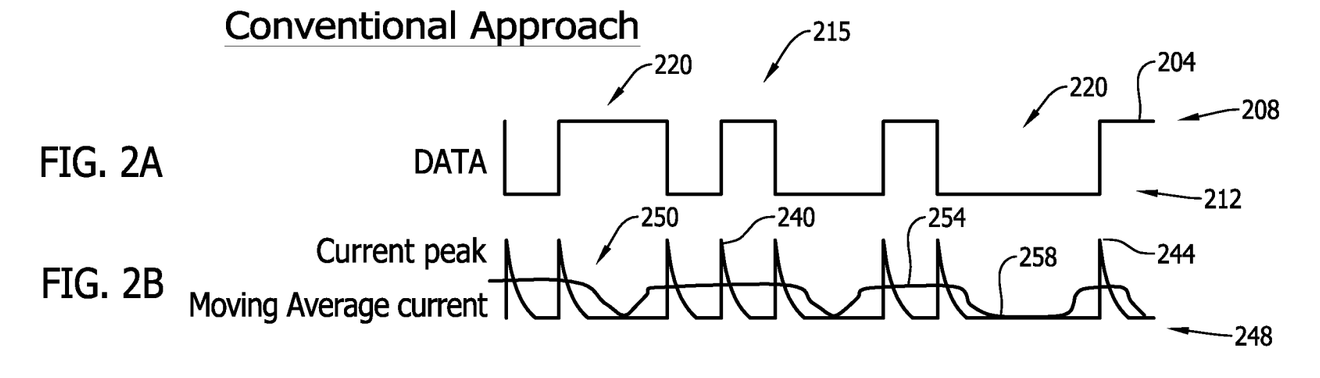
FIG. 2A illustrates an exemplary prior art data stream.
FIG. 2B illustrates a prior art time aligned plot of current draw and moving average current associated with the data stream of FIG. 2A.

FIG. 2 illustrates an exemplary primary data stream. As shown, the data transitions between a logic 0 level 212 and a logic 1 level 208. The data may transition between logic levels at every clock cycle 216 or may remain at the same logic level over consecutive clock cycles 220. The primary data stream 216 may be referred to as a data stream or a received signal. In CMOS technology, current is drawn from the power supply only at transitions to different logic levels, for example, switching from a logic level zero to a logic level one, or from a one to a zero level. As a result, power consumption, from the power supply or a power supply node, changes as a function of the data patterns on the primary data stream 216. In a system with hundreds of channels, the current draw, and associated voltage swing, is further increased when a large number of channels transition at the same time, based on a shared clock signal. For example, if 75 channels all transition or do not transition during the same clock cycle, the power supply ripple will be magnified.

FIG. 2B illustrates a time aligned corresponding plot of current draw and moving average current associated with the primary data stream of FIG. 2A. The current draw plot 240 has peaks 244 at a transition and then decays to a zero level 248 until the next transition. The current peaks correspond in time with the transitions as shown. The moving average current 250 also varies, although less drastically, than the peak current plot 240. The moving average current 250 varies between a maximum draw 254 and a minimum draw 258. The moving average current 250 dips when the data signal of FIG. 2A does not transition during a clock cycle because current is only drawn when a transition occurs.

The drawback to the conventional or prior art approach, resulting in the plots of FIGS. 2A, 2B, is that the variation in data transitions introduces variation in moving average current 250 that leads to variations in the supply voltage, also known as power supply noise, or ripple. This variation over time, in-sync with the high-speed data, creates ripples, which in turn degrade the signal and the power supply, from which other system components draw power. Thus, the ripples propagate into the power supply node, and affect not only the present channel, but also other channels that draw voltage and current from the power supply node. In addition, the data based transitions will introduce coupling into the adjacent or nearby channels and the overall effect is data corruption and noise on the present channel and other channels. One proposed solution is to utilize many capacitors to smooth the power supply output and reduce ripple, but this solution is costly, consumes valuable space, and adds additional components subject to failure.

Figure 3A:
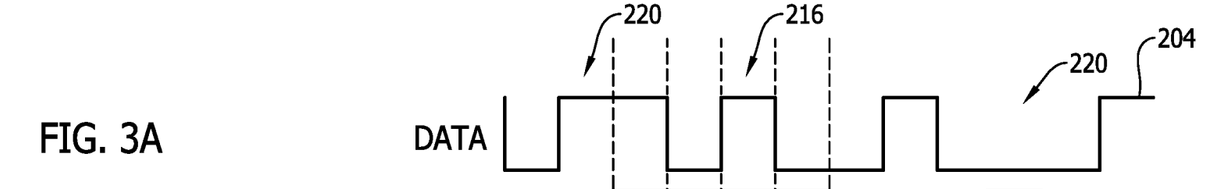
FIG. 3A illustrates an exemplary data stream.

FIG. 3A illustrates an exemplary primary data stream. The primary data stream of FIG. 3A is generally identical to the primary data stream of FIG. 2A and as such it is not discussed in detail again. It is provided for the discussion of FIGS. 3B and 3C.

Figure 3B:
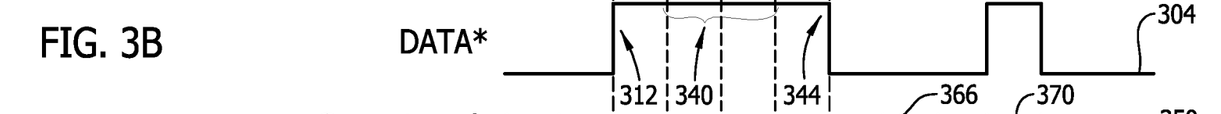
FIG. 3B illustrates a complementary data stream to that of FIG. 3A.

FIG. 3B illustrates a complementary data stream to that of FIG. 3A. The complementary data stream has a transition at every clock cycle in which there is not a transition in the primary data stream. For example, at clock cycle 308 the primary data stream 204 does not have a transition. As a result, the complementary data stream 304 does include a transition 312. However, during clock cycles 320, 324, 328 the primary data stream 204 transitions between logic levels. As a result, at clock cycles 320, 324, 328 the complementary signal 304 does not have transition and is maintained at the same logic level 340 as shown.

Next, at clock cycle 330, the primary data stream 204 does not transition so the complementary data stream 304 introduces a transition 344 to a 0 logic level. The complementary data stream 304 proceeds in this manner, introducing a transition at each clock cycle when there is not a transition in the primary data stream. Any logic, control system, or other element may be used to form the complementary data stream 304.

Figure 3C:
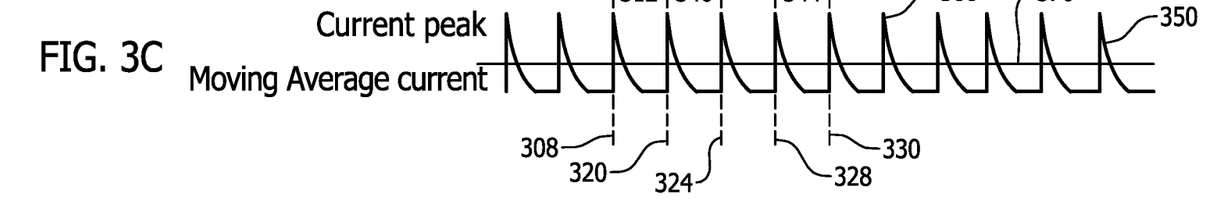
FIG. 3C illustrates a time aligned corresponding plot of current draw and moving average current associated with the data streams of FIGS. 3A and 3B.

FIG. 3C illustrates a time aligned corresponding plot of current draw and moving average current associated with the combined data streams of FIGS. 3A and 3B. In this plot, for the peak current signal 360 there is a current peak 366 at every clock cycle due to the transition at every clock cycle when considering both the primary data stream 204 and the complementary data stream 304. As a result, the moving average current 370 is generally stable and consistent and does not include and dips, peaks, or valleys as in FIG. 2B.

This reduces the current ripples and drops in voltage at the power supply which can disrupt not only the shown channel (primary channel), but also introduces jitter and disruption into other channels of a multichannel system which also rely on the shared power supply.

Figure 4A:
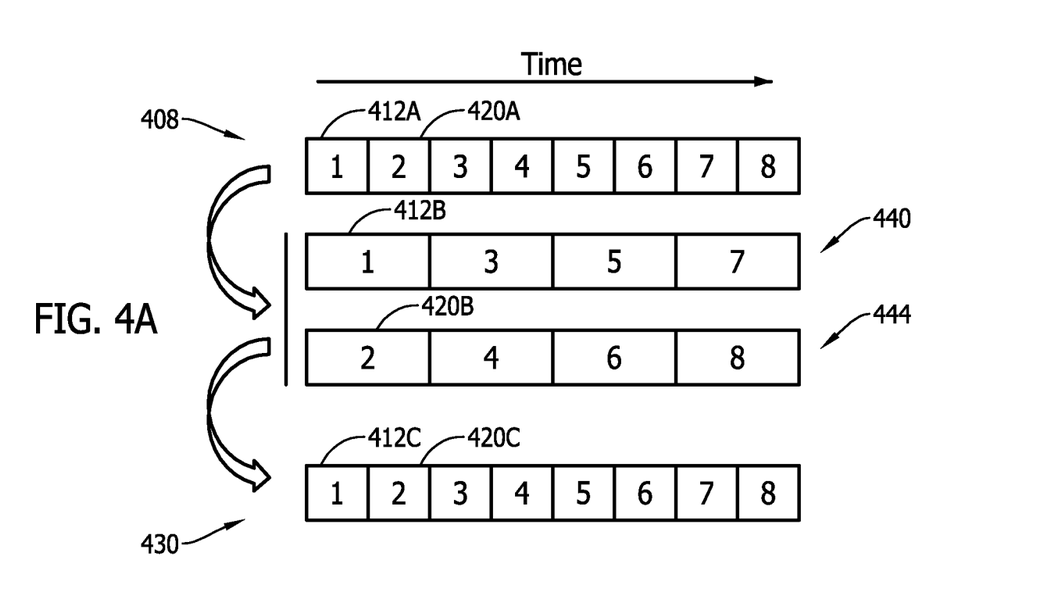
FIG. 4A illustrates a conventional method of data stream mapping.

FIG. 4A illustrates a conventional method of data stream mapping when creating the complementary data stream. As shown in FIG. 4A, an incoming (primary) data stream 408 is received. The incoming data stream 408 includes a number of bits, such as bit1 412A and bit2 420A and others as shown. This stream is represented over time. This bit stream 408 is degraded from the channel or due to other factors, and in this embodiment, it is preferred to retime or 'clean up' the data for subsequent processing or re-transmission. Depending on the nature of the data transmission, different parameter may be used to determine signal quality. The disclosed data stream is typically found in a processing system, such as on a back plane or bus, or in a crosspoint matrix, thus making this disclosed innovation compatible with any signaling or modulation format.

In one exemplary method of operation, the incoming data stream 408 is split into two lower rate bit streams 440, 444 for processing and retiming. Thus, bit1 412A becomes bit1 412B and bit2 420A becomes bit2 420B each in lower rate data stream. After processing and retiming, the two lower rate bit streams 440, 444 are serialized into a single high rate bit stream 430 which is at the same bit rate as the incoming data stream 408. In other embodiments, the incoming data stream 408 may be split into any number of lower rate bit streams for processing and the when recombined, the higher rate bit stream may be at the same or a different bit rate than the incoming data stream 408.

Figure 4B:
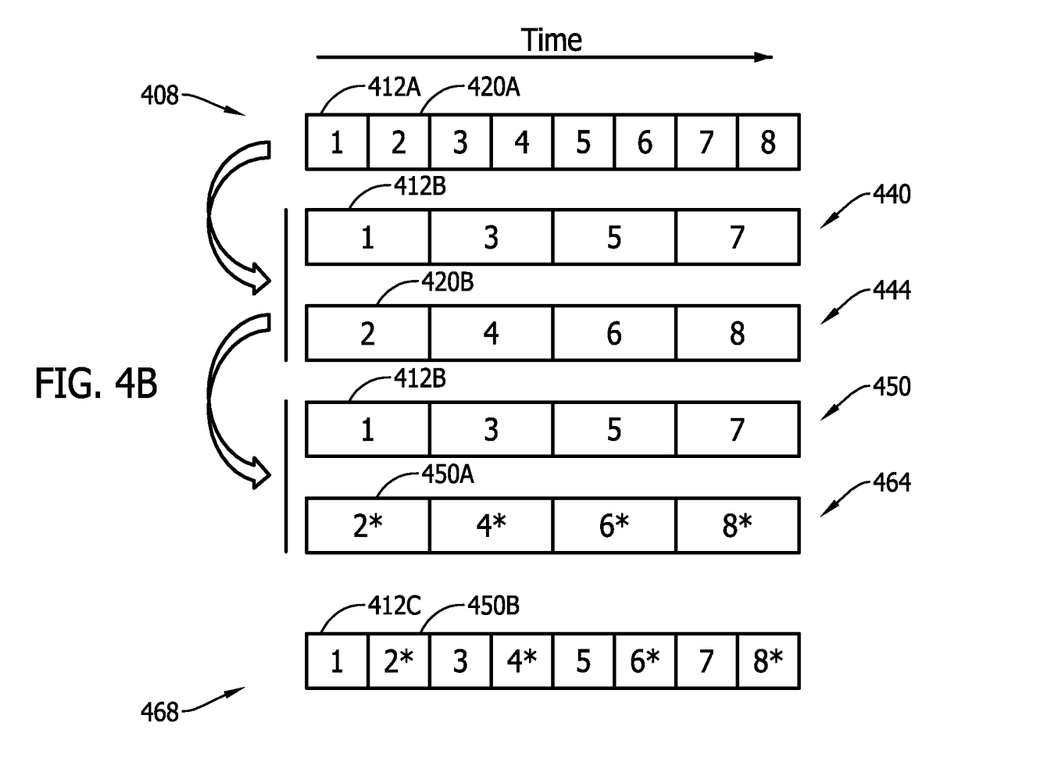
FIG. 4B illustrates a method for creating a complementary data stream.

FIG. 4B illustrates an exemplary method for creating a complementary data stream. This is but one possible method to create the complementary data stream and one of ordinary skill in the art may arrive at different methods of operation or techniques to create a complementary data stream which has an opposite data transition pattern than the incoming (primary) data stream. As compared to FIG. 4A, identical elements are labeled with identical reference numbers.

As shown, the incoming data stream 408 is processed as in the prior art to create the two lower rate data streams 440, 444. Thereafter, as part of the creation of the complementary data stream, one of the lower rate data streams 440, 444 has its logic levels inverted thereby creating processed low rate data streams 460, 464, one of which has inverted logic levels. In this embodiment, the low rate data stream 444 has its logic value inverted as compared to the low rate data stream 444 to create an inverted logic level bit stream 464. Thus, bit2 420B becomes inverted bit2 450A which has an inverted logic level.

Thereafter, the processed low rate data streams 460, 464 are serialized back into a high-speed data stream in a one to one interleaved manner thereby combining the low rate bit stream 460 with the inverted logic level bit stream 464 to create the complementary data stream 468.

Collectively, the complementary data stream 468 and the incoming data stream 408 have a transition at each clock cycle. This creates an average moving current, as shown in FIG. 3C, which does not include peak or valleys.

Figure 5:
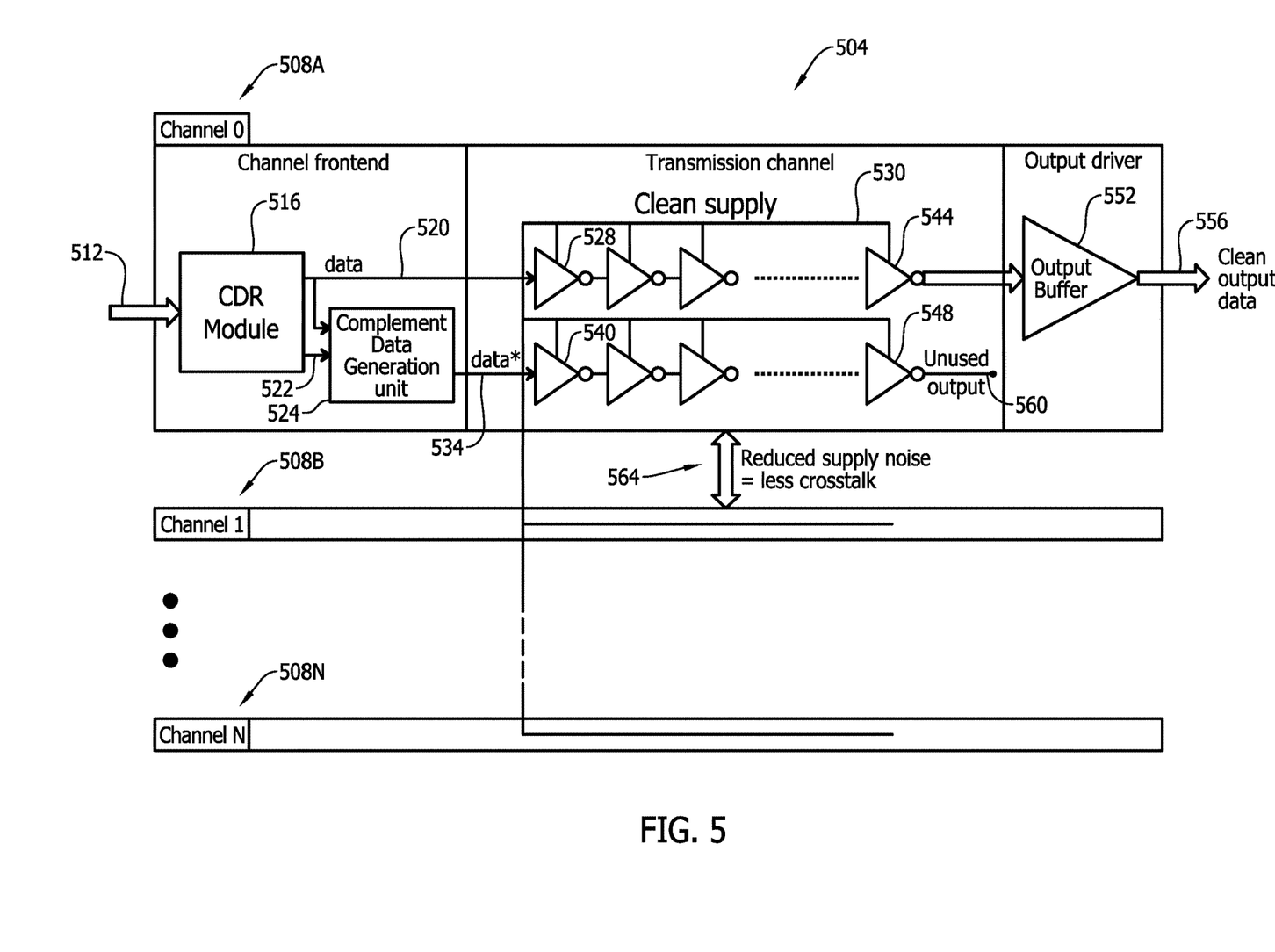
FIG. 5 illustrates a block diagram of an exemplary multi-channel system with a complementary data path.

FIG. 5 illustrates a block diagram of an exemplary multi-channel system with a complementary data path. This is but one possible example embodiment and one of ordinary skill in the art may arrive at other configurations for creating a complementary data stream and complementary data path, configured in proximity to the primary data path on which the primary data stream is processed. In the multi-channel system with a complementary data path 504 there are multiple channels including channel0 508A, channel1 508B, up through channelN 508N where N is any positive integer value. Due to space limitations, each channel may be in close proximity to other channels. In other embodiments, there may be only one channel.

Channel0 508A is discussed in detail and the other channels of the system 504 may be generally identical or may have a different configuration. Channel0 508A includes an input 512 configured to receive a primary data stream, which may be received from a channel, bus, backplane, another processing element, or any other device, path, or location. The primary data stream feeds into a CDR (clock data recovery) module 516 which processes the signal to extract a clock signal and to use the extracted clock signal to sample the incoming data stream with optimal timing. The CDR module 516 provides two outputs. One CDR output is the retimed and cleaned primary data stream, which is provided on output 520, while the extracted clock signal is provided on output 522. The primary data stream feeds into a network of processing elements 532, which in this example embodiment of a cross matrix switch, may include inverters 528, 544, one or more multiplexers, control logic, and other associated elements (collectively a switching matrix). In other embodiments, other hardware, software, or both may form the processing elements 532.

The one or more inverters 528, 544 connect to a power supply node 530 as shown. The other channels 508B, 508N also source power from the same power supply node 530. Thus, noise on the power supply node 530 affects all the processing elements connected thereto such as the other channels 508B, 508N. The one or more inverters 528, 544 and other associated processing elements (such as multiplexer or other elements of a crosspoint switch) are defined as the processing system 532. The processing system consumes most of the power in the system shown in FIG. 5 and as such having a complementary data path (including elements 540, 548) will provide the greatest amount of noise reduction. The output buffer 552, which is not mirrored in the complementary data path is not a high power consuming element.

The primary data stream also feeds into a complementary data generation unit 524. The complementary data generation unit 524 also receives the clock signal on output 522 from the CDR module 516. The complementary data generation unit 524 is any combination of hardware, software, or both configured to process a data stream and generates a complementary data stream. The complementary data generation unit 524 may comprise logic elements, a state machine, one or more inverters, registers, a processor executing machine executable instructions stored in a non-transitory format in a memory, or any combination of these elements or any other elements.

The output 534 of the complementary data generation unit 524 is a complementary data stream which feeds into a complementary data path comprising network of inverters including inverters 540, 548 and multiplexer (not shown). The primary data path and the complementary data path should be made identical or as similar as possible to provide the most effective noise cancellation. This network of inverters 540, 548 also draws power from the power supply node 530.

The output of inverter 544 is the processed primary data stream which feeds into an output buffer 552. The output buffer 552 buffers the data stream prior to presenting the cleaned and retimed data on an output 556. The output of inverter 548 is the complementary data stream, which is presented on output 560. However, the complementary data stream is not used, and instead terminated to an open circuit as shown. In other embodiment, other termination options are contemplated. Use of the complementary data stream path, such as exemplary elements 524, 540, 548 provides a more stable and uniform load on the power supply node 530 which reduces noise in the primary data stream and associated path as well as reducing noise that will couple to adjacent channels and reduces power supply noise on other channels 508B, 508N.

Figure 6:
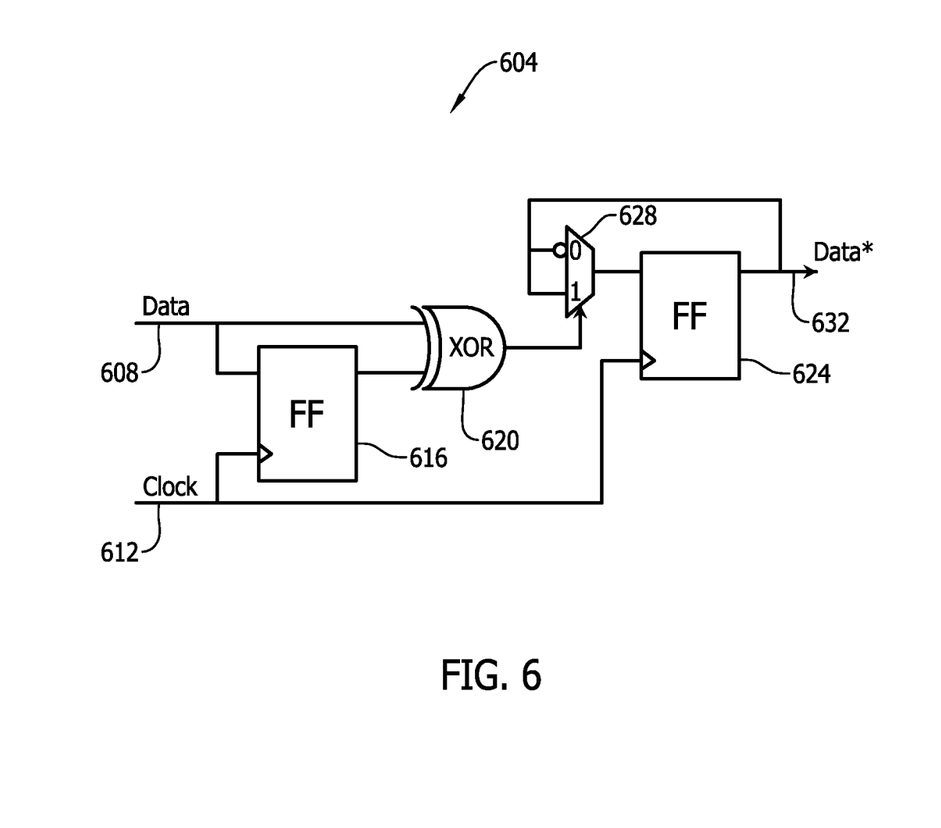
FIG. 6 illustrates a block diagram of logic elements configured to create a complementary data stream.

FIG. 6 illustrates a block diagram of a logic element system configured to create a complementary data stream. This is but one possible configuration of logic elements configured to create the complementary data stream. Other embodiments are possible which do not depart from the scope of the claims that follow. In this example embodiment of a complementary data stream creation module 604 (hereafter module), a primary data stream is received on data input 608 and a clock signal is received on clock input 612. These may be provided from a CDR module.

The primary data stream feeds into a XOR logic element and a first flip-flop 616. The first flip-flop 616 also receives the clock signal. The flip-flop selectively clocks in and clocks out the primary data stream responsive to the clock signal on the flip-flops clock input. The output of the first flip-flop 616 provides the data input to the XOR logic element 620. Operation of the XOR logic element 620 is generally understood in the art and as such is not described in detail herein. The following table defines the XOR function.

| INPUT | | OUTPUT |
| --- | --- | --- |
| A | B | A XOR B |
| 0 | 0 | 0 |
| 0 | 1 | 1 |
| 1 | 0 | 1 |
| 1 | 1 | 0 |

The output from the XOR logic element 620 connects to a multiplexer 628 to function as a control signal for the multiplexer. The multiplexer 628 receives two inputs, one of which is inverted as discussed below, which are feedback from a second flip-flop 624. The output of the multiplexer 628 has an output that is an input to the second multiplexer 624. The second flip-flop 624 also receives the clock signal as shown.

The second flip-flop 624 processes the multiplexer output, in connection with timing control from the clock signal to create the complementary data stream on output 632. The second flip-flop output 632 is fed back as inputs to the multiplexer 628 and one of the two flip-flop inputs is inverted. The XOR output controls which input to the multiplexer 628 is presented as the output of the multiplexer.

In operation, the primary data stream and clock signal are provided to the first flip-flop 616 which functions as a delay. The primary data stream is also presented to the XOR logic element 620. As a result of the delay function of the first flip-flop 616, the XOR logic element 620 is comparing two consecutive bits in the primary data stream. The XOR logic element 620 outputs a logic 1 value if there is transition, meaning the logic level of the incoming data is changes from a 1 to a 0 or from a 0 to a 1. Conversely, the XOR logic element 620 outputs a logic 0 value if there is not a transition. Stated another way, the XOR logic element 620 indicates whether a transition has occurred between sequential bits in the primary data stream.

The XOR logic element 620 is the control signal to the multiplexer 628. When the output of the XOR logic element 620 indicates a transition (1 logic level), then the lower input to the multiplexer 628 is output from the multiplexer. When the output of the XOR logic element 620 indicates no transition (0 logic level), then the upper input to the multiplexer 628 is output from the multiplexer. Both the inputs to the multiplexer 628 are the same signal, but the upper input is inverted. The second flip-flop 624 functions as a memory or register to hold information regarding the current state, which is then fed back into the multiplexer 628.

For a particular clock cycle, the current logic state of the output 632 (the complementary data stream) is maintained (no transition) if the primary data stream had a transition. This occurs because the lack of transition between bits in the primary data stream causes the XOR logic element 620 to output a logic 1 value, which in turn forces the multiplexer to output the same logic state that was fed into multiplexer input 1 by the second flip-flop 624. Due to the data on input 608 having a transition, the logic level on output 632 does not change, i.e., does not have a transition. In contrast, the current logic state of the output 632 is changed (a transition is introduced) if the data input signal (on input 608) did not have a transition, causing the XOR logic element 620 to output a logic 0 value, which in turn forces the multiplexer to output an inverted logic state that was fed into inverting multiplexer input 0 by the second flip-flop 624. Due to the data on input 608 not having a transition, the output logic level on output 632 changes, i.e., a transition is introduced in the complementary data stream.

Figure 7:
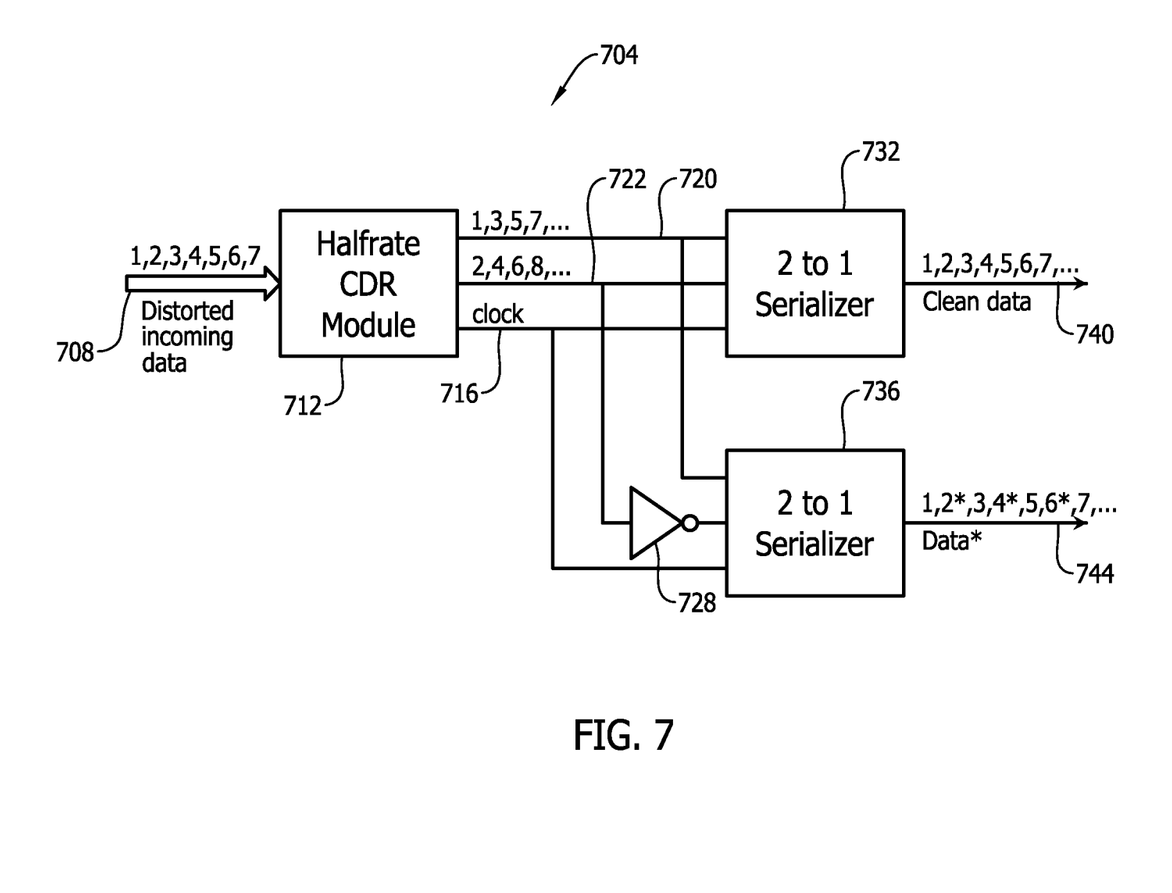
FIG. 7 illustrates a block diagram of another example embodiment of a system for creating a complementary data stream.

FIG. 7 illustrates a block diagram of an example embodiment of a system for the creation of a complementary data stream. This is but one possible configuration of logic elements configured to create the complementary data stream. Other embodiments are possible which do not depart from the scope of the claims that follow. The system 704 shown in FIG. 7 includes an input 708 configured to receive distorted data from a channel or other source. A data streams of bits 1, 2, 3, 4, 5, 6, 7 is received in this embodiment, much like the stream of bits 408 of FIG. 4. The incoming data stream is presented to a half-rate CDR module 712 which splits the incoming data stream into two lower rate data streams. Half-rate CDR modules are known by one of ordinary skill in the art and as such are described in detail herein. As shown, the output 720 carries bits 1, 3, 5, 7 while output 722 caries bits 2, 4, 6, 8.

A clock line 716 extends from the half-rate CDR module 712 and connects to a pair of 2-to-1 serializers 732, 736. The two lower speed bit streams on outputs 720, 722 are also provided to each of the 2-to-1 serializers 732, 736. However, the bits 2, 4, 6, 8 on output 722 are provided to an inverter 728 prior to being fed into the 2-1 serializer 736. Thus, the bits 2, 4, 6, 8 provided to the 2-1 serializer 736 are the inverse logic level of the bits levels output from the half-rate CDR module 712.

2-1 serializers 732, 736 are known and understood by one of ordinary skill in the art and as such are not described in detail herein. The 2-1 serializer 732, 736 combined each input into a single high-speed data stream. Any data rate change may be possible, but in this embodiment, the data rate out of the half-rate CDR module 712 is half the rate of the input signal while the 2-1 serializers 732, 736 double the bit rate of the input signals when forming the output signal.

The output 740 of serializer 732 carries the primary data stream which has been re-timed and had any jitter or other unwanted effects of the channel removed, or which has been switched to a desired output. The output 744 of serializer 736 carries the complementary data stream which has been re-timed and had any jitter or other effects of the channel removed and in which every other bit is at an opposite logic level of the primary data stream. Thus, in this example embodiment, bits 2, 4, 6, and so on are at an opposite logic level as compared to the primary data stream.

The complement data stream, with the primary data stream, has a transition at every clock cycle thereby establishing a consistent moving average power draw from the power supply node.

Figure 8:
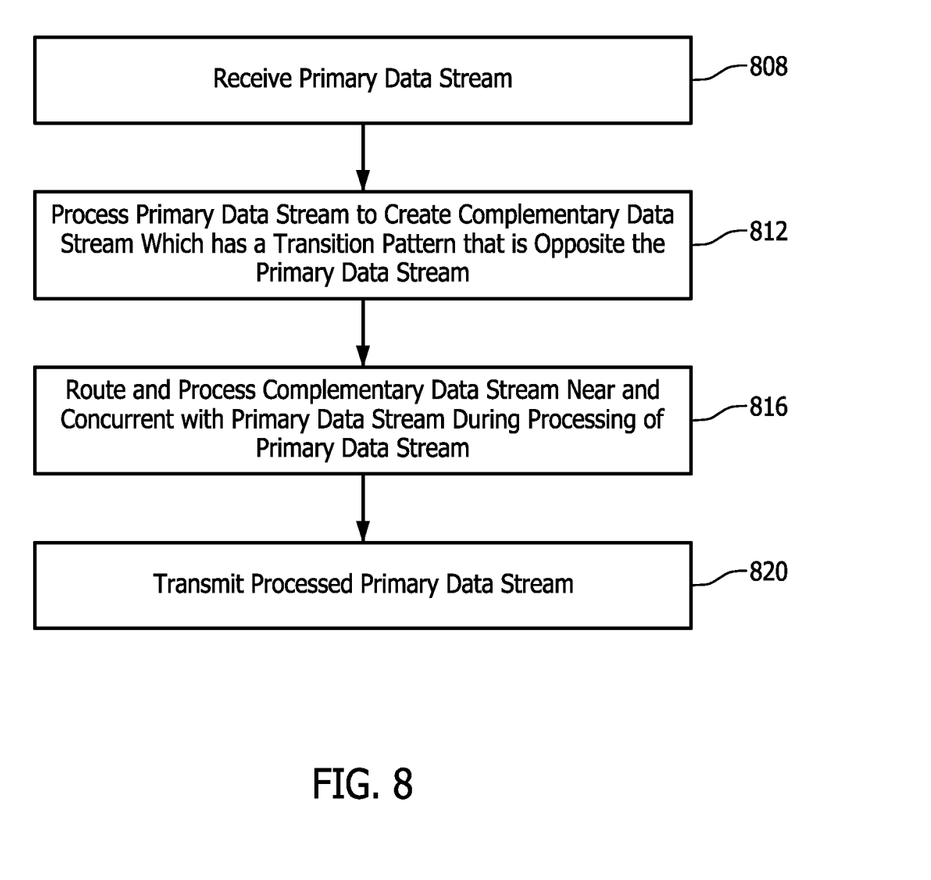
FIG. 8 illustrates an operation flow diagram of an example method of operation.

FIG. 8 illustrations an operation flow diagram of an example method of operation. This is but one possible method of operation for the innovation disclosed herein. Other methods are possible and contemplated which do not depart from the claims that follow. This method starts at a step 808 receiving a primary data stream. The primary data stream may be received from a channel, analog front end, another data processing element, or any other location or device. Next, at a step 812, this method of operation processes the primary data stream to create a complementary data stream which has a transition pattern that opposite of the primary data stream such that during each clock cycle that the primary data stream has a logic level transition (from one logic level to another) the complement data stream does not have a logic level transition. And, during each clock cycle that the primary data stream does not have a logic level transition (from one logic level to another) the complement data stream has a logic level transition.

At a step 816 the complementary data stream is processed and routed near and concurrent with the primary data stream during the processing of primary data stream. By having both the primary data stream, and the transition opposite complementary data stream created and processed that the same time, the average moving current is maintained generally consistent due to a logic level transition occurring at every clock cycle. This reduces noise in the primary channel and other channels in a multi-channel system. At a step 820, the method transmits the processed (retimed) primary data stream while the complementary data stream is terminated at an open circuit or other termination.

Figure 9:
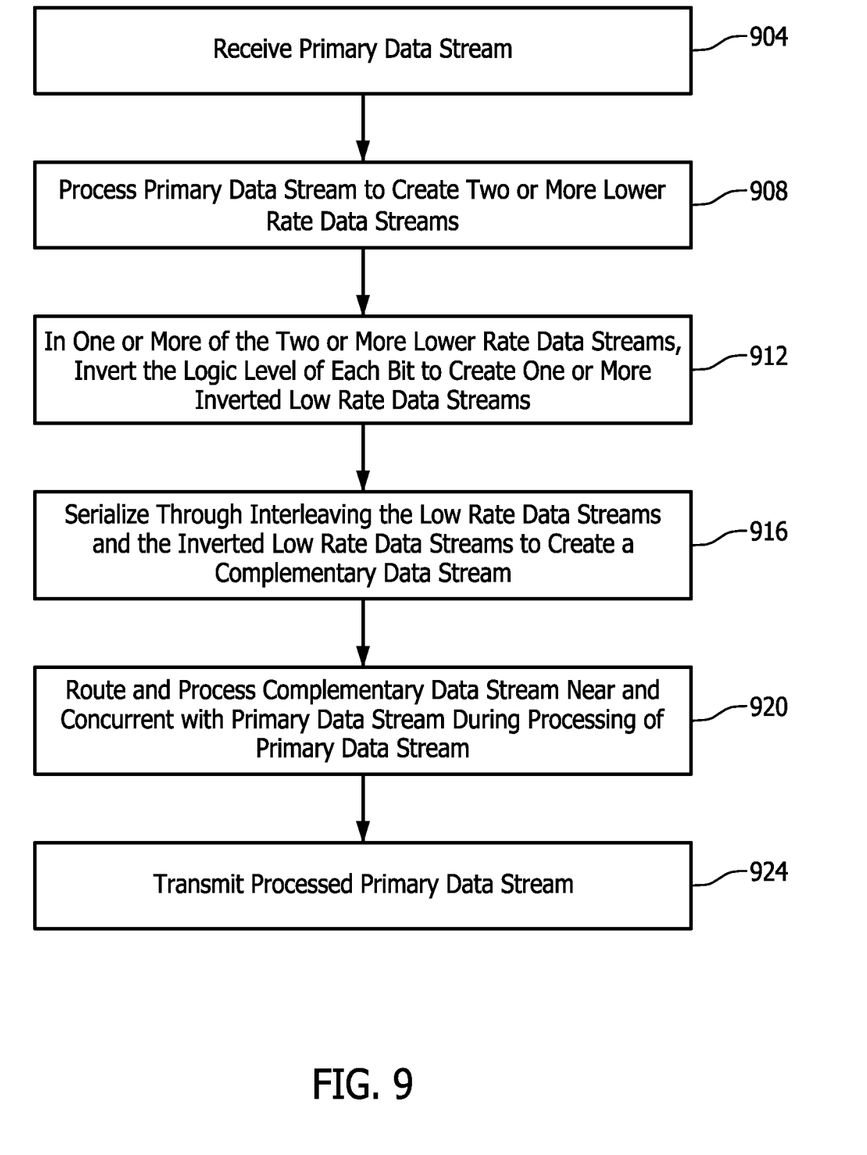
FIG. 9 illustrates an operation flow diagram of an alternative example method of operation.

FIG. 9 is an operation flow diagram of an alternative example method of operation. This is but one possible method of operation for the innovation disclosed herein. Other methods are possible and contemplated which do not depart from the claims that follow. This method starts at a step 904 in which the system receives the primary data stream. Then at a step 908, the system processes the primary data stream to create two or more lower rate data streams. This may occur using a half-rate CDR module, logic elements, or any other device configured to split a data stream into two or more lower rate data streams.

At a step 912 the system processes one or more of the two or more lower rate data streams to invert the logic level of each bit to create one or more low rate data streams which have inverted logic levels. This is illustrated in low rate inverted bit stream 464 in FIG. 4B.

At a step 916, a 2-to-1 serializer or other device, serializes, with interleaving bits from the two low rate data streams (the non-inverted and the inverted low rate data streams) to create the complementary data stream. As discussed herein, it is understood that other methods and systems may be used to create the complementary data stream.

At a step 920, the system is configured to route and process the complementary data stream near and concurrent in time with the primary data stream. This establishes a consistent current draw, at each clock cycle, on the power supply node, which in turn reduces noise introduced into the power supply node, and other channels, through the power supply node. Thus, not only is performance on the channel under discussion (primary channel) improved, other channels in a multichannel system also realize a benefit.

At a step 924, the primary data stream is processed. The complementary data stream is not transmitted and instead may be terminated to an open circuit or other termination configuration.

Although this method of operation includes the step of re-creating a data stream at the original rate, it is also contemplated that the primary data stream may be duplicated and then, in the duplicated data stream the logic level for every other bit, may be inverted. This alternative method avoids the step of creating a two or more low rate data streams.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for reducing noise in a signal comprising
receiving a primary data stream at a first data rate, the primary data stream comprising a stream of bits having logical values;
splitting the primary data stream to create a first group of one or more data streams at a second data rate and a second group of one or more data streams at the second data rate, such that the second data rate is different than the first data rate;
processing the second group of data streams to invert the logic values of the bits that form the data streams in the second group to create one or more processed data streams;
combining the first group of one or more data streams with the one or more processed data streams to create a complementary data stream; and
processing the primary data stream and the complementary data stream concurrently with a data processing system to reduce noise on a power supply that provides current to the data processing system, wherein the method occurs in a crosspoint switch.

2. The method of claim 1 wherein combining comprises interleaving.

3. The method of claim 1 wherein splitting comprises converting the primary data stream into a first data stream in the first group and a second data stream in the second group.

4. The method of claim 1 wherein the complementary data stream has a logic level transition at every clock cycle that the primary data stream does not have a logic level transition.

5. The method of claim 1 wherein the combining is performed by a serializer.

6. The method of claim 1 wherein processing the primary data stream and the complementary data stream concurrently with a data processing system establishes a constant average current draw from the power supply.

7. A method for reducing noise on a power supply due to signal processing comprising:
receiving a primary data stream, the primary data stream comprising a stream of bits having logical values;
creating a complementary data stream, the complementary data stream having an opposite transition pattern than the primary data stream such that at clock cycles when the primary data stream has a logic level transition the complementary data stream does not transition, and at clock cycles when the primary data stream does not have a logic level transition, the complementary data stream has a transition;
processing the primary data stream and the complementary data stream concurrently with a data processing system to reduce noise on a power supply such that the power supply provides current to the data processing system; and
transmitting or buffering the primary data stream, after processing, and terminating the complementary data stream to an open circuit.

8. The method of claim 7 wherein multiple data processing systems connect to and draw power from the power supply.

9. The method of claim 7 wherein processing the primary data stream and the complementary data stream concurrently comprises processing at the same time and on adjacent paths to be in close proximity.

10. The method of claim 7 wherein the reduction of noise on a power supply occurs due to the processing of the primary data stream and the complementary data stream concurrently creating an average power draw from the power supply with reduced variation.

11. The method of claim 7 wherein the method occurs in a multi-channel crosspoint switch and the reduction of noise occurs in other channels of the multi-channel crosspoint switch.

12. A system for retiming and recovering a data stream with reduce noise introduction comprising:
a complementary data stream generation unit configured to generate a complementary data stream, the complementary data stream having a logic level transition at each clock cycle in which a primary data stream does not have a logic level transition;
a signal processing unit configured to concurrently process the primary data stream and the complementary data stream to create a processed primary data stream and a processed complementary data stream;
a transmitter configured to transmit the processed primary data stream; and
a power supply configured to supply current to the signal processing unit, the power supply having stable average current draw due to the primary data stream and the complementary data stream, when considered together, having a logic level transition at every clock cycle.

13. The system of claim 12 wherein the signal processing unit comprises one or more inverters and one or more multiplexers.

14. The system of claim 12 wherein the complementary data stream generation unit comprises logic elements configured to process the primary data stream and a clock signal to generate the complementary data stream.

15. The system of claim 12 wherein the signal processing unit is a multi-channel crosspoint switch.

16. The system of claim 12 wherein the processed complementary data stream is terminated to an open circuit.

17. A method for reducing noise on a power supply, in a multi-channel crosspoint switch, due to signal processing comprising:
receiving a primary data stream, the primary data stream comprising a stream of bits having logical values;

creating a complementary data stream, the complementary data stream having an opposite transition pattern than the primary data stream such that at clock cycles when the primary data stream has a logic level transition the complementary data stream does not transition, and at clock cycles when the primary data stream does not have a logic level transition, the complementary data stream has a transition;

processing the primary data stream and the complementary data stream concurrently with a data processing system to reduce noise on a power supply such that the power supply provides current to the data processing system, wherein the reduction of noise occurs in other channels of the multi-channel crosspoint switch.

18. The method of claim 17 wherein multiple data processing systems connect to and draw power from the power supply.

19. The method of claim 17 wherein the reduction of noise on a power supply occurs due to the processing of the primary data stream and the complementary data stream concurrently creating a average power draw from the power supply with reduced variation.

* * * * *